United States Patent
Zhang

(10) Patent No.: US 9,559,729 B2
(45) Date of Patent: Jan. 31, 2017

(54) SAME-BAND COMBINER USING DUAL-BANDPASS CHANNEL FILTERS

(75) Inventor: Yunchi Zhang, Wallingford, CT (US)

(73) Assignee: Alcatel Lucent, Boulogne-Billancourt (FR)

(*) Notice: Subject to any disclaimer, the term of this patent is extended or adjusted under 35 U.S.C. 154(b) by 1150 days.

(21) Appl. No.: 13/075,805

(22) Filed: Mar. 30, 2011

(65) Prior Publication Data
US 2012/0249263 A1    Oct. 4, 2012

(51) Int. Cl.
| | |
|---|---|
| H01P 1/213 | (2006.01) |
| H04B 1/00 | (2006.01) |
| H03H 7/01 | (2006.01) |
| H04B 1/50 | (2006.01) |

(52) U.S. Cl.
CPC ........... H04B 1/0057 (2013.01); H01P 1/213 (2013.01); H03H 7/0115 (2013.01); H04B 1/50 (2013.01)

(58) Field of Classification Search
CPC ......... H04B 1/0057; H04B 1/50; H01P 1/213; H03H 7/0115
USPC ....... 455/78, 82, 552.1, 553.1; 333/126–129, 333/132
See application file for complete search history.

(56) References Cited

U.S. PATENT DOCUMENTS

| | | | |
|---|---|---|---|
| 5,568,101 A | 10/1996 | Konishi et al. | |
| 5,949,302 A * | 9/1999 | Sarkka | 333/126 |
| 6,658,263 B1 | 12/2003 | Ke et al. | |
| 7,376,440 B2 * | 5/2008 | Forrester et al. | 455/553.1 |
| 2002/0118080 A1 * | 8/2002 | Saito et al. | 333/202 |
| 2005/0136875 A1 | 6/2005 | Skarby et al. | |
| 2008/0161055 A1 | 7/2008 | Fischer | |

FOREIGN PATENT DOCUMENTS

| | | |
|---|---|---|
| CN | 1898878 A | 1/2007 |
| JP | 2007-515895 A | 6/2007 |
| WO | 02078119 A1 | 10/2002 |
| WO | 2005/062476 A1 | 11/2004 |

OTHER PUBLICATIONS

International Search Report for PCT/US2012/027723 dated Mar. 5, 2012.
JP Office Action dated Apr. 8, 2016 for JP Application No. 2014-502587.

(Continued)

Primary Examiner — Benny Lee
Assistant Examiner — Rakesh Patel
(74) Attorney, Agent, or Firm — Kramer & Amado, P.C.

(57) ABSTRACT

Various embodiments relate to an apparatus and related method for transmission and reception of a plurality of a carrier signals comprising one or more dual-band channels through a same-band combiner. A device such as a base station may include a same-band combiner that comprises a plurality of dual-bandpass filters and a combining element to transmit and receive the carrier signal. Each of the dual-bandpass filters may transmit and receive a channel, with each dual-bandpass filter including separate reception and transmission passbands for the separate frequencies in the dual-band channel. The combining element may separate and combine the one or more dual-band channels, with each of the dual-bandpass filters connected in parallel processing separate dual-band channels.

16 Claims, 4 Drawing Sheets

(56) References Cited

OTHER PUBLICATIONS

First Office Action for Japanese Application No. 2014-502587 dated Nov. 11, 2014.
First Office Action for Korean Patent Application No. 10-2013-7025597 dated Jan. 26, 2015.
Chinese Office Action dated Aug. 21, 2014; Chinese Application No. 201280015285.5.

\* cited by examiner

SAME-BAND COMBINER USING DUAL-BANDPASS CHANNEL FILTERS

TECHNICAL FIELD

Various exemplary embodiments disclosed herein relate generally to signal processing circuits.

BACKGROUND

Devices such as radio repeaters and wireless base stations may include a combination of filters and other components capable of receiving and transmitting wireless signals. Such transceivers may use a combiner in order to enable functionality like feeder sharing. A transceiver may employ feeder sharing when it uses the same radio frequency (RF) feeder to interconnect the base transceiver station (BTS) or node B to an antenna.

It would be desirable to implement a base station that enables feeder sharing for various channels. In particular, it would be desirable to implement a same-band combiner that is capable of carrying multiple channels.

SUMMARY

It would be desirable to implement a base station that enables feeder sharing for various channels. In particular, it would be desirable to implement a same-band combiner that is capable of carrying multiple channels. Such an arrangement would be useful when multiple carriers are sharing a single antenna.

A brief summary of various exemplary embodiments is presented. Some simplifications and omissions may be made in the following summary, which is intended to highlight and introduce some aspects of the various exemplary embodiments, but not to limit the scope of the invention. Detailed descriptions of a preferred exemplary embodiment adequate to allow those of ordinary skill in the art to make and use the inventive concepts will follow in the later sections.

Various embodiments may relate to a [claim 1]

Various embodiments may also relate to a [claim 12]

It should be apparent that, in this manner, various exemplary embodiments enable a same-band combiner using dual-bandpass channel filters. Particularly, by using dual-bandpass filters for the plurality of reception and transmission carrier signals, insertion losses may be minimized, while enabling better rejection of other frequencies through the addition of transmission zeroes.

BRIEF DESCRIPTION OF THE DRAWINGS

In order to better understand various exemplary embodiments, reference is made to the accompanying drawings wherein.

DETAILED DESCRIPTION

Figure 1:
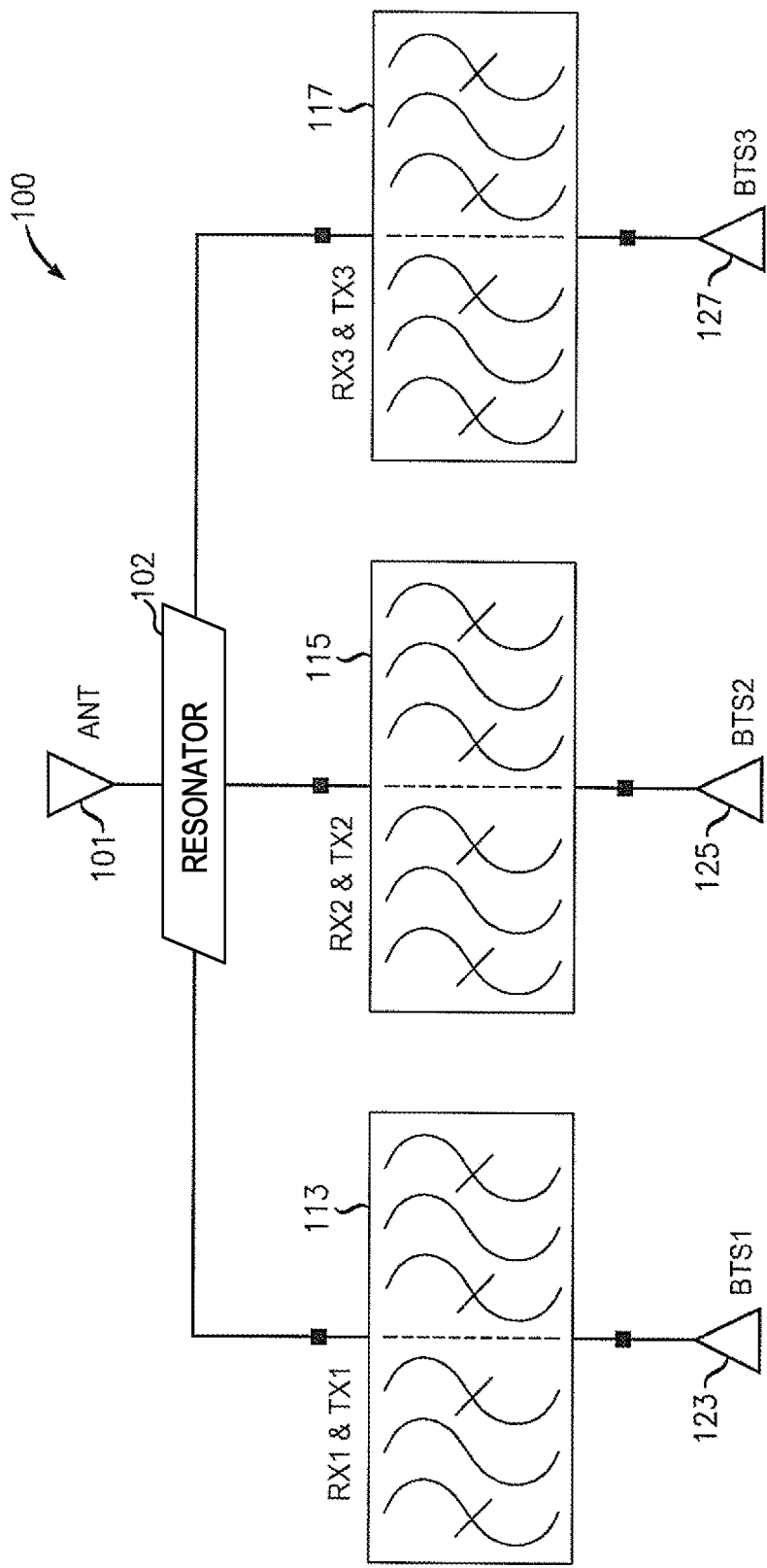
FIG. 1 illustrates a circuit schematic of an exemplary same-band combiner.

Referring now to the drawings, in which like numerals refer to like components or steps, there are disclosed broad aspects of various exemplary embodiments.

FIG. 1 illustrates a circuit schematic of an exemplary same-band combiner. Same-band combiner 100 may include an antenna 101, a combining element 102, dual-bandpass filters 113, 115, 117, and base transceiver station (BTS) components 123, 125, 127. Same-band combiner 100 may be a component in a device such as a wireless base station device or a transceiver that may process multiple channels of signals.

For example, in the illustrative embodiment, the same-band combiner 100 includes three dual-bandpass filters 113-117 that process three separate channels of reception (RX) and transmission (TX) frequencies that are passed between the antenna 101 and the plurality of BTS components 123-127. Each one of the channels handled may include a pair of RX and TX signals. Same-band combiner 100 may be used, for example, to implement feeder sharing, which allows for communications systems using the same radio frequency (RF) feeder to interconnect the BTS components 123-127 to the antenna 101.

Same-band combiner 100 may be a component in a wireless communications system and may be configured to operate based on the protocol used within the wireless communications system. The wireless communications system may employ, for example, GSM (Global System for Mobile Communications), UMTS (Universal Mobile Telecommunications System), or similar wireless communications protocols that use separate uplink (i.e., TX) and downlink (i.e., RX) frequency bands surrounding a target frequency. When the wireless communications system employs GSM protocol using the 900 MHz frequency band for a channel, the dual-bandpass filter 113 may, for example, process an RX frequency band centered around 890 MHz, while a TX frequency band may be centered around 910 MHz.

Antenna 101 may comprise a transducer that may transmit and/or receive electromagnetic waves. Antenna 101 may comprise one or more conductors that may convert the electromagnetic waves into one or more signals. In some embodiments, the converted electrical signal may comprise a combination of multiple channels, with each of the multiple channels including separate RX and TX signals. For example, the antenna 101 may comprise a feed antenna that collects incoming radio waves, converts the radio waves into electric currents, and transmits the electrical current to other components in the combiner 100. In some embodiments, the feed antenna may also include the combining element 102. A person of skill in the art would be aware of the components needed to implement an antenna 101 for a transceiver such as the same-band combiner 100.

Combining element 102 may include a component that may transmit signals between the antenna 101 and the plurality of filters 113-117. Combining element 102 may include, for example, a transmission line. In other embodiments, the combining element 102 may further include other components, such as a resonator. For example, in some embodiments, the combining element 102 may further comprise a coaxial cavity resonator.

Filters 113, 115, 117 may comprise dual-bandpass filters that may process multiple bands of an electrical signal. For example, in the illustrative embodiment, each of the dual-bandpass filters 113-117 may process a channel including a combined signal that includes a pair of separate RX and TX channel. Each of the filters 113-117 may include separate passbands for the RX and TX channels within a channel, with a guard band separating the low passband from the high passband. Filters 113-117 may handle high power signals, such as signals above 50 W or even 100 W. For example, the dual-bandpass filters 113-117 may handle combined signals with powers over 500 W.

Each of the filters 113-117 may be designed to have poles and zeroes. Similarly, each of the dual-bandpass filters 113-117 may be designed to include one or more transmission zeroes within their respective stop bands. A transmission zero is a frequency where signal transmission between an input and output is stopped. While transmission zeroes located within the passband of a filter 113 may prevent the filter from processing the signal correctly, transmission zeroes within the stopband of the dual-bandpass filter 113 may, for example, lower energy consumed in transmitting stopband frequencies and increase the rejection of frequencies within the stopband.

Each of the dual-bandpass filters 113-117 may also have characteristic insertion loss. Insertion loss may be defined as the loss of signal power due to inserting a device in a transmission line. This may be related to the attenuation and may be based on the ratio of the power delivered by the input device and the power received by the output device. The insertion loss of the dual-bandpass filters 113-117 may be based on the physical characteristics of the circuit comprising the dual-bandpass filters 113-117. For example, in some embodiments, the physical characteristics of the dual-bandpass filters 113-117 may be similar to that of a single bandpass filter so that the addition of either one dual-bandpass filter or one single-bandpass filter would cause the same insertion loss within the same-band combiner 100.

Base transceiver stations (BTS) 123, 125, 127 may comprise hardware that enables wireless communication between user equipment (UE), such as a mobile device, and the wireless communications system. The type of BTS 123-127 may be based on the wireless communications protocol in use by the system. For example, BTS 123-127 may be used in the same-band combiner 100 when the communications system uses GSM. In other embodiments, BTS 123-127 may comprise similar hardware, such as a plurality of "node B" devices, which serve similar purposes for wireless communications systems that use UMTS protocol. In some embodiments, the BTS 123-127 may include components such as a power amplifier, a control function, a baseband receiver unit (BBxx), and similar parts used to control wireless signals and communicate with other devices within the wireless communications system. In some embodiments, each of the BTS 123-127 may be configured to operate and control signals for a specific channel. In such instances, the same-band combiner 100 may use a plurality of BTS 123-127 to operate over a wider range of operation frequencies. For example, when the same-band combiner 100 uses the UMTS protocol, it may include a plurality of at least three node B devices 123-127 to operate with the 1700, 1900, and 2100 MHz frequency bands, respectively.

Figure 2:
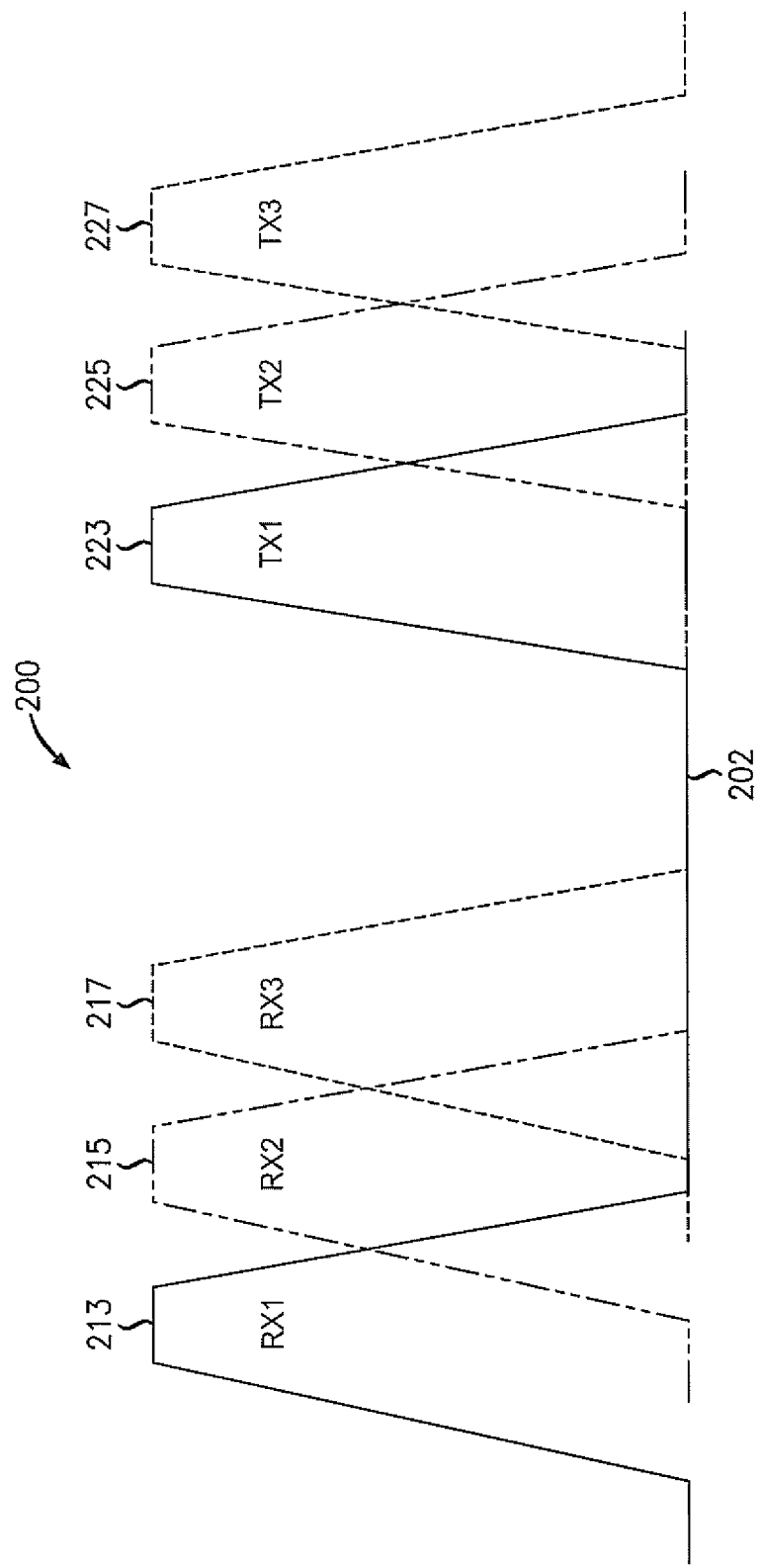
FIG. 2 illustrates a design for an exemplary three-channel, same-band combiner.
Figure 3:
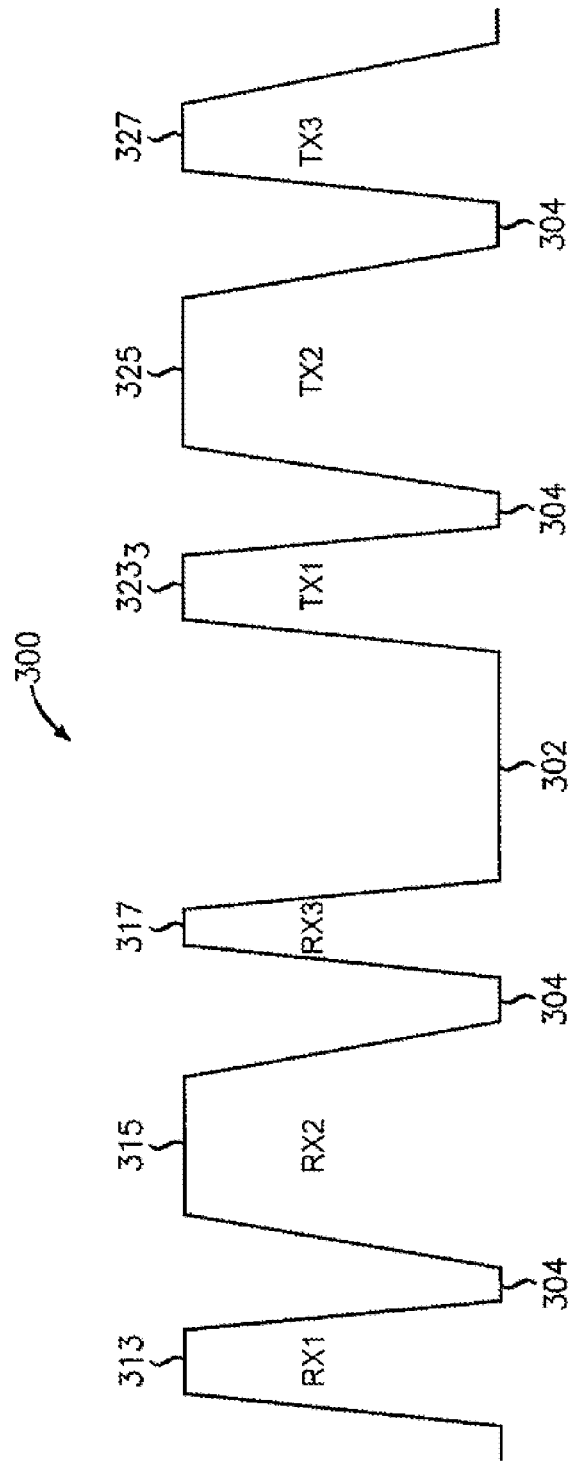
FIG. 3 illustrates another design for an exemplary three-channel, same-band combiner.

FIGS. 2 & 3 illustrate two respective designs for exemplary three-channel, same-band combiners. Same-band combiners 200, 300 similarly contain three dual-bandpass filters that may process pairs of reception (RX) signals and transmission signals (TX) signals. Same-band combiner 200 includes overlap between the transition bands of the RX filters 213, 215, 217 and between the transition bands of the TX filters 223, 225, 227, respectively. In contrast, the same-band combiner 300 includes stop bands 304 between the RX filters 313, 315, 317 and between the TX filters 323, 325, 327, respectively. Each of the same-band combiners 200, 300 includes a guard band 202, 302 that separates the plurality of RX filters 213-217, 313-317 from the plurality of TX filters 223-227, 323-327.

In each of the same-band, multiple channel combiners 200, 300, each of the dual-bandpass filters 113-117 may contain paired RX and TX filters. For example, the dual-bandpass filter 113 may comprise RX filter 213 and TX filter 223. Each of the dual-bandpass filters 113-117 may be tuned to pass through a specific frequency range. In some embodiments, the configuration of the filters 113-117 may be similar and may therefore have similar characteristics, such as the width of the passband, the amplitude of the gain, the width of the transition band, and the roll-off rate. In other embodiments, one or more of the filter characteristics may differ. For example, the width of the passbands for RX filter 313 and for RX filter 315 may differ. In other embodiments, the characteristics of paired passbands may differ, such as when the width of the passband for the RX filter 315 is substantially different from the width of the passband for the TX filter 325.

The RX filter 213 may be configured to include a passband based on the wireless communications protocol in use. For example, the dual-bandpass filter 113 may operate within a UMTS framework and may therefore be configured to operate within the 900 MHz frequency band. RX filter 213 and TX filter 223 of the dual-bandpass filter 113 may therefore be configured to have passbands centered around 890 MHz and 920 MHz, respectively.

Guard band 202, 302 may comprise the frequency band between the RX filter and the TX filter. In some embodiments, the guard band may comprise the band between the RX filter operating at the highest frequency and the TX filter operating at the lowest frequency. For example, in the illustrative embodiment, guard band 302 in FIG. 3 may comprise the frequency band between the RX filter 317 and the TX filter 323. In other embodiments, the guard band may comprise the frequency band between paired RX and TX filters. For example, in such embodiments, the guard band 202 may comprise the frequency band between the RX filter 215 and the TX filter 225.

During operation, each of the dual-bandpass filters 113-117 may transmit signals that are within the passbands of their component filters 213-217, 223-227. In some embodiments, the combining element 102 may combine the plurality of resultant filtered signals so that the resultant combined signal includes portions from all of the passbands of the dual-bandpass filters 113-117.

Figure 4A:
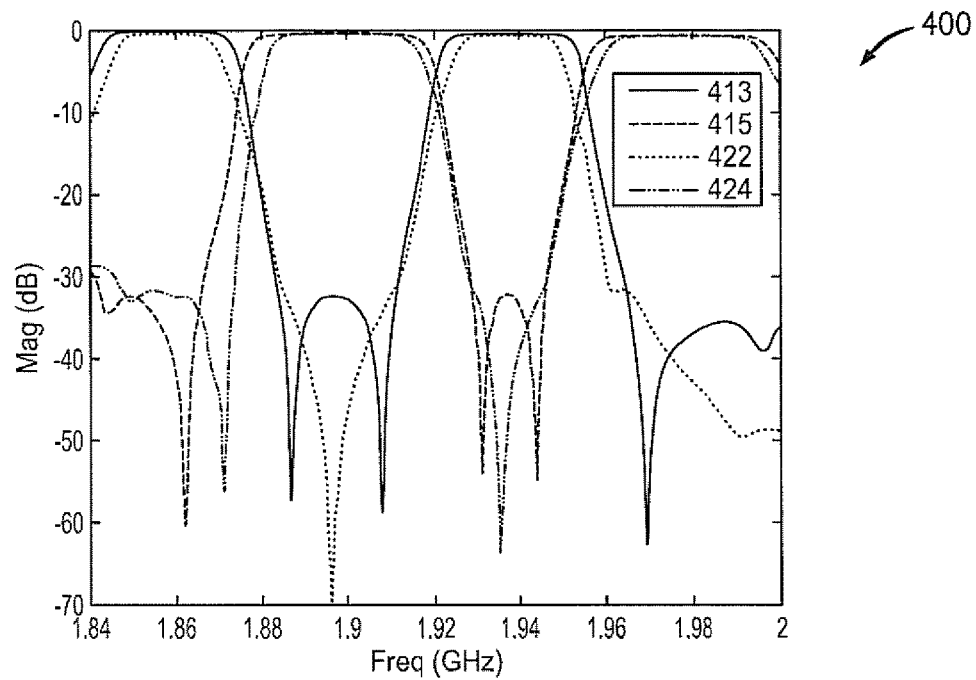
FIGS. 4A & 4B illustrate frequency response diagrams for an exemplary same-band combiner.
Figure 4B:
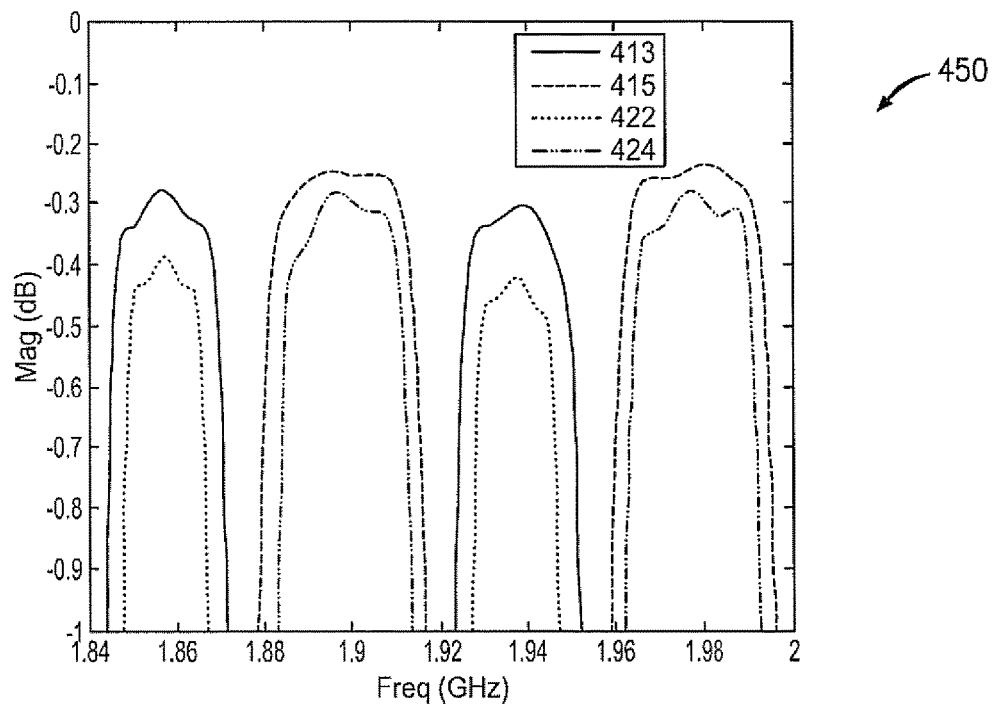

FIGS. 4A & 4B illustrate other frequency response diagrams for an exemplary same-band combiner. Graphs 400 and 450 illustrate the output of a same-band combiner 100 that includes two dual-bandpass filters. Graph 400 illustrates the filter response over a 70 dB range, while graph 450 illustrates the similar filter response over a 1 dB range. Lines 413 and 415 illustrate the output of the same-band combiner 100 within the 1.92 MHz frequency band. Line 413 may include a dual-bandpass filter 113 that includes the RX filter 213 centered approximately at 1.86 MHz and the TX filter centered approximately at 1.94 MHz. Similarly, line 415 may include a dual-bandpass filter 115 that includes the RX filter 215 centered at 1.9 MHz and the TX filter centered at 1.98 MHz.

Lines 413, 415 may be compared with lines 422, 424. Lines 422-424 may illustrate the output of a same-band combiner that includes, for example dual-duplexers to separately processing RX and TX channels. While both the same-band combiner 100 and the combiner that includes dual-duplexers may use a resonator (Q=5000) to combine the filtered signals, the same-band combiner 100 may include more transition zeroes. As a result, lines 413-415 illustrate that the output of the dual-bandpass filters 113-115 have a broader bandwidth, better rejection, and lower insertion loss than similar filtering devices.

It should be apparent from the foregoing description that various exemplary embodiments of the invention may be implemented in hardware and/or firmware. Furthermore, various exemplary embodiments may be implemented as instructions stored on a tangible machine-readable storage medium, which may be read and executed by at least one processor to perform the operations described in detail herein. A tangible machine-readable storage medium may include any mechanism for storing information in a tangible form readable by a machine, such as a personal or laptop computer, a server, or other computing device. Thus, a tangible machine-readable storage medium may include read-only memory (ROM), random-access memory (RAM), magnetic disk storage media, optical storage media, flash-memory devices, and similar storage media.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo-code, and the like represent various processes that may be substantially represented in tangible machine readable media and so executed by a computer or processor, whether or not such computer or processor is explicitly shown.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be effected while remaining within the spirit and scope of the invention. Accordingly, the foregoing disclosure, description, and figures are for illustrative purposes only and do not in any way limit the invention, which is defined only by the claims.

I claim:

1. A wireless base station comprising:
a same-band combiner configured to receive and transmit a plurality of dual-band channels comprising:
an antenna configured to transmit and receive the plurality of dual-band channels;
a plurality of dual-bandpass filters, each dual-bandpass filter associated with a reception passband and a transmission passband separated by a defined guard band, wherein each of the plurality of dual-bandpass filters comprises a dual-mode resonator; and
a combining element connected to the antenna and the plurality of dual-bandpass filters that is configured to combine the plurality of dual-band channels associated with the plurality of dual-bandpass filters to produce a combined carrier signal, wherein the combining element comprises a resonator that connects the plurality of dual-bandpass filters in parallel.

2. The apparatus of claim 1, wherein the reception passbands and the transmission passbands of the plurality of dual-bandpass filters are each separated by at least 3 kHz.

3. The apparatus of claim 1, wherein the defined guard band is at least 30 kHz.

4. The apparatus of claim 1, wherein the plurality of dual-bandpass filters comprises:
at least two dual-bandpass filters connected in parallel.

5. The apparatus of claim 1, wherein each of the plurality of dual-band channels is configured to communicate with a distinct provider.

6. The apparatus of claim 1, wherein widths of the reception passbands are substantially different from each other.

7. The apparatus of claim 1, wherein at least one of the plurality of dual-bandpass filters is rated to handle a power above 100 W.

8. The apparatus of claim 1, wherein widths of the reception passbands are substantially different from widths of the transmission passbands.

9. A method comprising:
receiving, by an antenna in a same-band combiner in a wireless base station, a receive carrier signal comprising a plurality of dual-band channels;
receiving, by a plurality of dual-bandpass filters, wherein each of the plurality of dual-bandpass filters comprises a dual-mode resonator, through a combining element connected to the antenna, the receive carrier signal, wherein each of the dual-bandpass filters is associated with a reception passband and a transmission passband separated by a defined guard band, wherein the combining element comprises a resonator that connects the plurality of dual-bandpass filters in parallel;
receiving, by a plurality of components in the wireless base station, a plurality of filtered receive signals from the plurality of dual-bandpass filters;
transmitting, by the plurality of components in the wireless base station, a plurality of transmit signals to the plurality of dual-bandpass filters;
transmitting, by the plurality of dual-bandpass filters through the combining element, a plurality of filtered transmit-band signals; and
transmitting, through the antenna, a transmit carrier signal comprising the plurality of filtered transmit-band signals received by the combining element.

10. The method of claim 9, wherein each of the plurality of dual-band channels is configured to communicate with a distinct provider.

11. The method of claim 9, wherein widths of each of the reception passbands are substantially different from each other.

12. The method of claim 9, wherein widths of the reception passbands are substantially different from widths of the transmission passbands.

13. The method of claim 9, wherein the reception passbands and the transmission passbands of the plurality of dual-bandpass filters are each separated by at least 3 kHz.

14. The method of claim 9, wherein the defined guard band is at least 30 kHz.

15. The method of claim 9, wherein the plurality of dual-bandpass filters comprises at least two dual-bandpass filters connected in parallel.

16. The method of claim 9, wherein at least one of the plurality of dual-bandpass filters is rated to handle a power above 100 W.

* * * * *